United States Patent [19]

Kagami

[11] Patent Number: 4,975,881
[45] Date of Patent: Dec. 4, 1990

[54] SEMICONDUCTOR MEMORY DEVICE PROVIDED WITH AN IMPROVED REDUNDANT DECODER

[75] Inventor: Akihiko Kagami, Tokyo, Japan

[73] Assignee: NEC Corporation, Tokyo, Japan

[21] Appl. No.: 457,900

[22] Filed: Dec. 27, 1989

[30] Foreign Application Priority Data

Dec. 27, 1988 [JP] Japan .................................. 63-331701

[51] Int. Cl.$^5$ .............................................. G11C 8/00
[52] U.S. Cl. .................................... 365/200; 371/10.3
[58] Field of Search .................. 365/200, 225.7, 230.6; 371/8

[56] References Cited

U.S. PATENT DOCUMENTS

| | | | |
|---|---|---|---|
| 4,660,178 | 4/1987 | Hardee et al. | 365/200 |
| 4,723,227 | 2/1988 | Murotani | 365/200 |
| 4,791,319 | 12/1988 | Tagami et al. | 365/200 |

*Primary Examiner*—James W. Moffitt
*Attorney, Agent, or Firm*—Sughrue, Mion, Zinn, Macpeak & Seas

[57] ABSTRACT

A semiconductor memory device having a redundant memory cell group selectable by a redundant decoder operable by a small power consumption is disclosed. The redundant decoder comprises a plurality of address program circuits which store address of a defective memory cell or cells and a control circuit for enabling the address program circuits when at least one defective memory cell is present and disenabling the address program circuits when no defective memory cell is present.

5 Claims, 3 Drawing Sheets

SEMICONDUCTOR MEMORY DEVICE PROVIDED WITH AN IMPROVED REDUNDANT DECODER

BACKGROUND OF THE INVENTION

1. Field of the Invention

The present invention relates to a semiconductor memory device, and more particularly to a redundant decoder of the semiconductor memory device.

2. Description of the Related Art

Memory capacity of semiconductor memory devices has been remarkably increasing. With the increase in the capacity of semiconductor memories, redundant circuit technology has been introduced. The redundant circuit has a redundant row or column of memory cells which are added for a normal memory cell array and a redundant decoder for selecting the redundant row or column of memory cells. If the normal memory cell array contains any defective memory cell or cells in a row or column, the address corresponding to the defective row or column of memory cells into the redundant decoder, thereby replacing the defective row or column of memory cells with the redundant row or column of memory cells. Thus, the defective memory chip is relieved as a functionally good memory chip.

One typical structure of the conventional redundant decoder comprises a multi-input logic circuit such as a NAND or NOR gate, a plurality of address program circuits and a redundancy enable circuit. Each of the address program circuits include a fuse circuit programmable into one of two different states, an address buffer circuit responsive to one of address signals for generating true and complementary signals thereof and a selective transfer circuit for applying one of the true and complementary signals to the multi-input logic circuit according to the programmed state of the fuse circuit. The redundant enable circuit includes a fuse circuit to be programmed into one of first and second states. The first state of the redundant enable circuit enables the multi-input logic circuit to make it responsive to the signals transferred from the selective transfer circuits, while the second state of the redundant enable circuit disenables the multi-input logic circuit to set its output signal at non-selective level irrespective of the transferred signals from the selective transfer circuits. Each of the fuse circuits include a fusible link coupled between two power sources and a DC current flows when the fusible link is not blown out. Accordingly, a relatively large amount of DC current is caused in the redundant decoder through the fuse circuits therein.

SUMMARY OF THE INVENTION

It is an object of the present invention to provide a semiconductor memory device having a redundant structure operable with a reduced amount power consumption.

It is another object of the present invention to provide a semiconductor memory device having an improved redundant decoder which can operate with a small power consumption.

The semiconductor memory device according to the present invention comprises a normal memory cell array, a redundant memory cell array, and a redundant decoder for selecting the redundant memory cell array when at least one defective memory cell is contained in the normal memory cell array and the defective memory cell is designated by address signals. The redundant decoder includes a plurality of address program circuits storing an address of the defective memory cell and a control circuit for enabling the plurality of address program circuits when at least one defective memory cell is present in the normal memory cell array and disenabling the plurality of address program circuits when the normal memory cell array contains no defective memory cell.

According to the present invention, all the address program circuits are controlled between the enabled state and the disenabled state by the control circuit, and therefore it is no more necessary to provide a fuse circuit causing a DC current in each of the address program circuits for controlling it. Accordingly, the redundant decoder according to the present invention can operate with a small power consumption.

BRIEF DESCRIPTION OF THE DRAWINGS

The above and further objects, features and advantages of the present invention will become more apparent from the following detailed description taken in conjunction with the accompanying drawings, wherein.

DETAILED DESCRIPTION OF THE INVENTION

Figure 1:
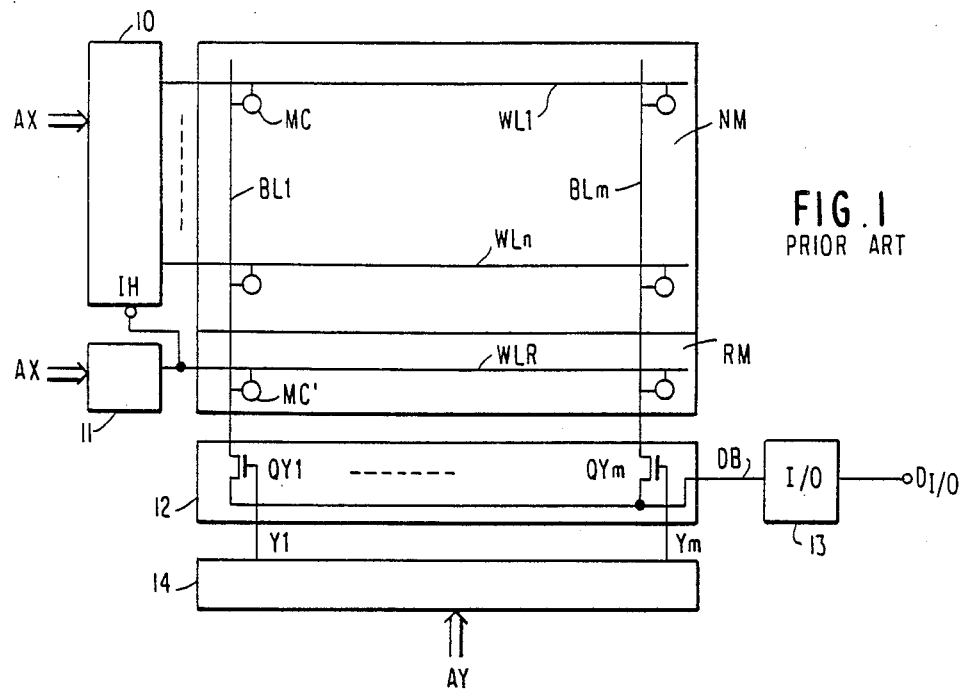
FIG. 1 is a schematic block diagram of a semiconductor memory device in the prior art.

Prior Art:

With reference to FIG. 1, the memory device comprises a semiconductor memory device having a redundant structure will be explained.

As shown in FIG. 1, a normal memory cell array NM having normal word lines $WL_1$-$WL_n$ arranged in rows, a plurality of bit lines $BL_1$-$BL_m$ arranged columns, and a plurality of memory cells MC, a redundant memory array RM having a redundant word line WLR and a plurality of redundant memory cells coupled to the redundant word line and the bit lines, a normal row decoder 10 for operatively selecting one of the normal word lines $WL_1$-$WL_n$, a redundant row decoder 11 for operatively selecting the redundant word line WLR, a column selection circuit 12 having a plurality of transfer transistors $QY_1$-$QY_m$ coupled between the bit lines $BL_1$-$BL_m$ and a data bus line DB coupled to an input/output circuit 13, and a column decoder 14 for selectively enabling one of the transfer transistors of the column selection circuit 12. If all of the memory cells MC of the normal array NM, the redundant row decoder 11 is set in a disenabled state by an internal redundant enable circuit. To the contrary, if the normal memory array NM contains a defective memory cell or cells coupled to one word line, e.g. WLi, the redundant decoder is set in enabled state by the internal redundant enable circuit, and selects the redundant word line when the contents of row address signals AX correspond to the word line WLi coupled to the defective memory cell. In this instance, the normal decoder 10 is disenabled at its inhibit input IH coupled to the output of the redundant decoder 11 in a known way.

An example of the redundant decoder 11 will be explained with reference to FIGS. 2 to 4.

Figure 2:
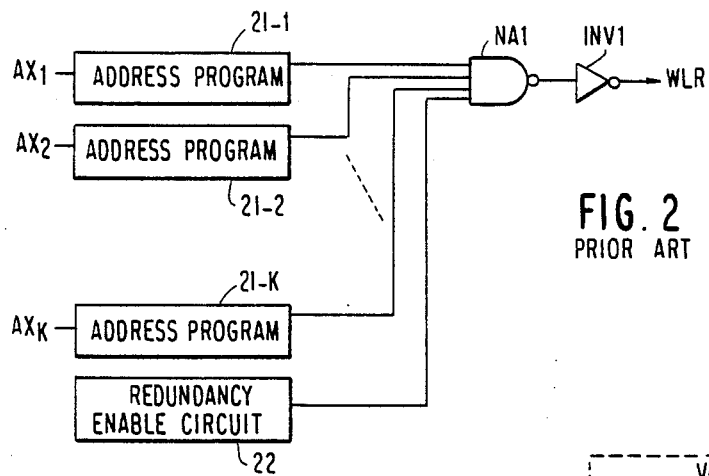
FIG. 2 is a schematic circuit diagram showing a redundant decoder in the prior art.

FIG. 2 shows the structure of the redundant decoder 11. The redundant decoder 11 comprises a plurality of address program circuits 21-1 to 21-k receiving row address signals AX1–AXk respectively, the redundant enable circuit 22, a NAND gate NA1 and an inverter INV2. The structure of the redundant enable circuit 22 is shown in FIG. 3 and is composed of a fuse F1, an N-channel FET (NFET) $Q_1$ and an inverter INV2. The address program circuit 21-i includes a fuse F2i, an NFET $Q_2$, inverters INV3, INV4, INV5, a first CMOS transfer gate composed of an NFET $Q_4$ and a P-channel FET (PFET) $Q_3$, and a second CMOS transfer gate composed of an NFET $Q_6$ and a PFET $Q_5$. Other address program circuits have the same structure as 21-1.

Operations of the conventional redundant decoder will be explained below.

When there is no defective address in the normal array NM, the fuse F2 of the redundancy enable circuit 22 is not blown, and "H" is input to the INV2, so that the output WLR of the redundancy decoder remains "L" for any address. When there exists a defective address, on the other hand, the fuse F1 of the redundancy enable circuit 22 is blown and a fuse F2 is blown in the address program circuit that corresponds to a defective address among the plurality of address program circuits. In the address program circuit which receives an address signal AXi (i=1 to k), a fuse F2i in the address program is not blown when the address signal AXi is to be programed but is blown when $\overline{AXi}$ is to be programed. That is, the address program circuit produces a true signal when the fuse is not blown and produces an inverted signal when the fuse is blown. Namely, the gate ($Q_3$, $Q_4$) is provided between the output and each of the true address signal and the gate ($Q_5$, $Q_6$) is provided between the output and the inverted signal thereof, and is controlled by the fuse for a defective address program to select an output. For example, when the external address have changed from AX1, AX2 and $\overline{AX3}$ into AX1, $\overline{AX2}$ and AX3 with the defective addresses just being AX1, $\overline{AX2}$ and AX3, the outputs of the address program circuit that receives address signals AX1, AX2 and AX3 change from "H", "L" and "L" into "H", "H" and "H", respectively, and are input to the gate of the NAND gate NA1 so that the output WLR of the redundant decoder changes from "L" into "H". The output WLR of the redundant decoder that has assumed "H" activates the redundant word lime WLR to which the redundancy memory cells are connected.

It is presumed here that ten address program circuits 21-1 to 21-k, 22 are needed in the redundant decoder 11 shown in FIG. 2. In this case, power consumption during the standby period is maximum when there is no defective address, i.e., when none of the fuses F2i and F1 is blown. If the consumption of current is 10 μA per the program circuit (21-1 to 21-k, 22), then the total consumption of current inclusive of that for the redundant decoder is 110 μA.

As explained above, in the conventional redundant decoder, the power consumption is large particularly when there is no defective address. When, for example, ten address program circuits are connected, the above current becomes greater than 100 μA, which means a great standby current. This presents a serious problem from the standpoint a tendency of decreasing the power consumption of the memory. Furthermore, an increased number of MIS transistors are required resulting in an increase in the chip areas.

EMBODIMENTS OF THE INVENTION

Figure 5:
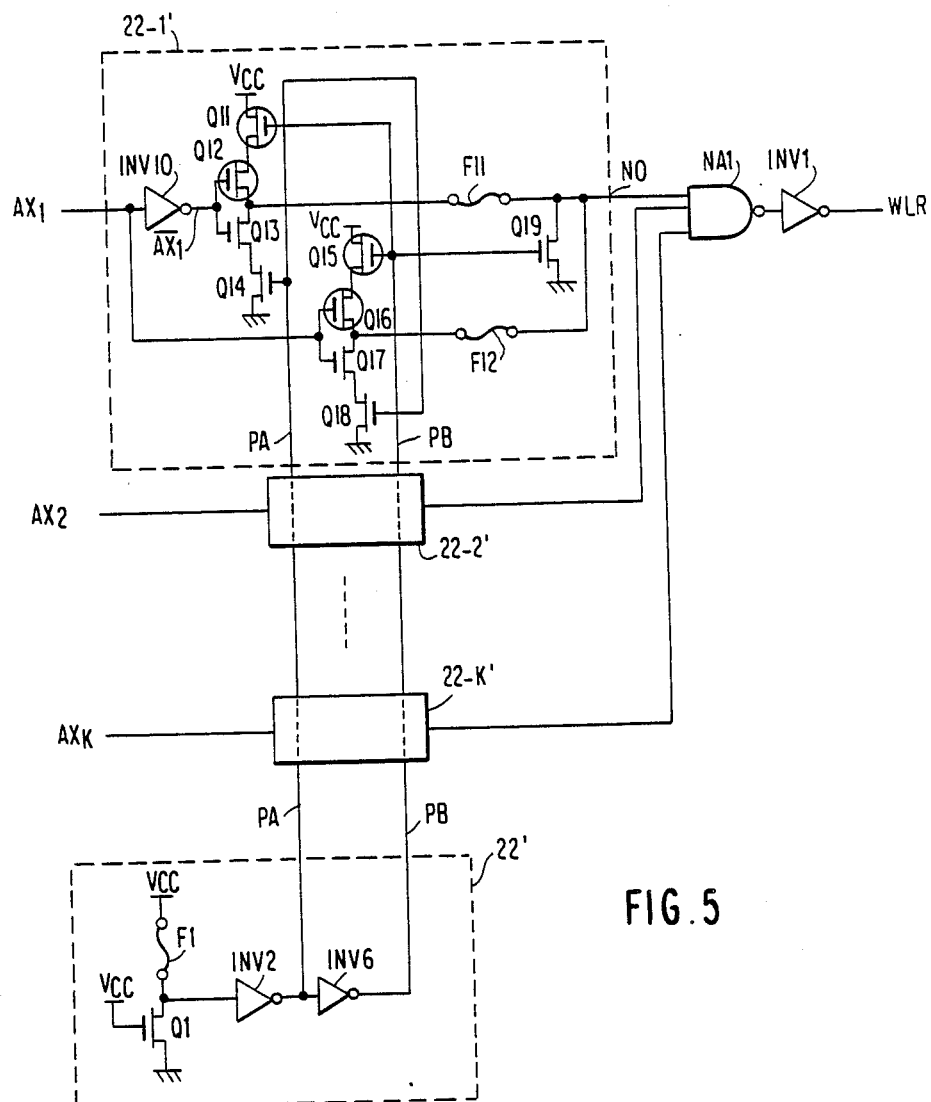
FIG. 5 is a schematic circuit diagram of the redudant decoder according to a first embodiment of the present invention.

With reference to FIG. 5, the redundant decoder according to a first embodiment of the present invention will be explained. In the following explanations, the elements or portions corresponding to those in the previous drawings are denoted by the same or similar references and detailed explanation therefor will be omitted.

Figure 3:
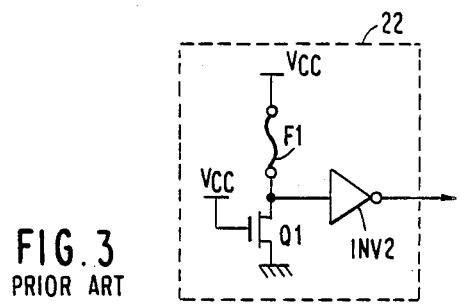
FIG. 3 is a schematic circuit diagram showing a redundant enable circuit in the prior art.
Figure 4:
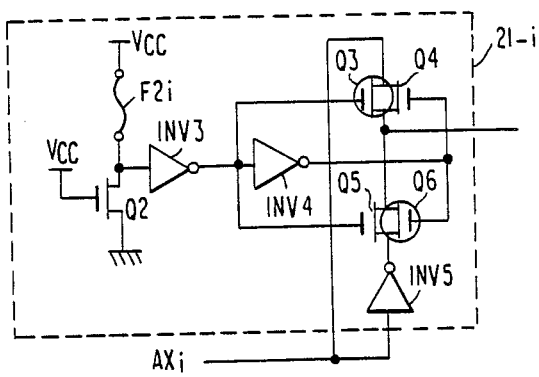
FIG. 4 is a schematic circuit diagram showing an address program circuit in the prior art.

The redundant decoder according to the embodiment is obtained by employing the redundant enable circuit 22' and the address program circuits 22-1' to 22-k' in place of the circuit 22 and the program circuits 22-1 to 22-k of FIGS. 2 to 4. The address program circuit 22-1' includes an inverter INV10 receiving the row address signal AX1 and generating its inverted signal $\overline{AX1}$, a first controllable inverter having PFETs $Q_{11}$, $Q_{12}$ and NFETs $Q_{13}$, $Q_{14}$ coupled between the power voltage Vcc and the ground potential GND and receiving the signal $\overline{AX1}$ at gates of $Q_{12}$ and $Q_{13}$, a second controllable inverter having PFETs $Q_{15}$, $Q_{16}$ and NFETs $Q_{17}$, $Q_{18}$ and receiving the signal AX1 at gates of $Q_{16}$ and $Q_{17}$, a first fuse F11 coupled between the output of the first controllable inverter ($Q_{11}$–$Q_{14}$) and an output node NO, a second fuse F12 coupled between the second controllable inverter ($Q_{15}$–$Q_{18}$) and the output node NO, and a clamp NFET $Q_{19}$ coupled between NO and GND. Other address program circuits 22-2' to 22-k' have the same circuit structure as 22-1'.

The redundant enable circuit 22' further includes an inverter INV6 in addition to the circuit 22 of FIG. 2, and the output PA of the inverter IV2 is applied to the gates of the FETs $Q_{11}$ and $Q_{14}$ of the respective address program circuits 22-1' to 22-k' while the output PB of the inverter INV6 is applied to the gates of the FETs $Q_{15}$, $Q_{18}$ and $Q_{19}$ of the respective address program circuits 22-1' to 22-k'.

Next, operation of this embodiment will be explained.

When there exists no defective address in the normal memory array NM, the fuse F1 is not blown. Since the FET $Q_1$ has a large on-resistance, the inverter circuit INV2 receives the "H" level to generate PA of "L" level so that the first inverters composed of $Q_{11}$ to $Q_{14}$ and the second inverter composed of $Q_{15}$ to $Q_{18}$ are not activated in the plurality of address program circuits 22-1' to 22-k', and the FET $Q_{19}$ is turned on in the respective circuits 22-1' to 22-k'. Therefore, the plurality of address program circuits 10 produce outputs which are all "L" for any address. Therefore, the redundant decoder produces the non-selective output of "L". When there exists a defective address in the normal memory array NM, on the other hand, the fuse F1 of the circuit 22' is blown, so that all the address program circuits are enabled. Also, either the fuse F11 or the fuse F12 is blown in response to the defective address in each of the plurality of address program circuits 22-1' to 22-k'. In the address program circuit 22-1' which receives the address signal AX1, for example, the fuse F12 is blown when AX1 is to be programed and the fuse F11 is blown when $\overline{AX1}$ is to be programed.

It is now presumed that the defective addresses are the combination of AX1, $\overline{AX2}$, and $\overline{AX3}$. Here, if the external addresses change from AX1, $\overline{AX2}$ and AX3 into AX1, $\overline{AX2}$ and $\overline{AX3}$, the outputs of the address program circuits that receive address signals AX1, AX2 and AX3 change from "H", "H" and "L" into "H", "H" and "H" respectively and are input to the inputs of the NAND circuit NA1. Therefore, the output WLR of the redundant decoder changes from "L" into "H". The output WLR change of the redundant decoder from "L" to "H" activates the redundant word line (WLR) to which the redundancy memory cells are connected.

In the redundant decoder of this embodiment, the fuse F1 is not blown when there is no defective address, and the electric current flows at all times from the source of power to GND via the MIS transistor $Q_1$. However, since the standby current does not flow through the address program circuits 22-1' to 22-k', the consumption of current can be greatly decreased. That is, only when there exists the defective address (i.e., only when F1 is blown), the address program circuits are activated by the control circuit which consists of the fuse F1, the FET $Q_1$ and inverters INV2 and INV6, and there flows an electric current. Moreover, when the FET $Q_{10}$ of the redundant enable circuit 22' has a large on-resistance as in this embodiment, the through current can be decreased to be smaller than 10 $\mu$A.

Figure 6:
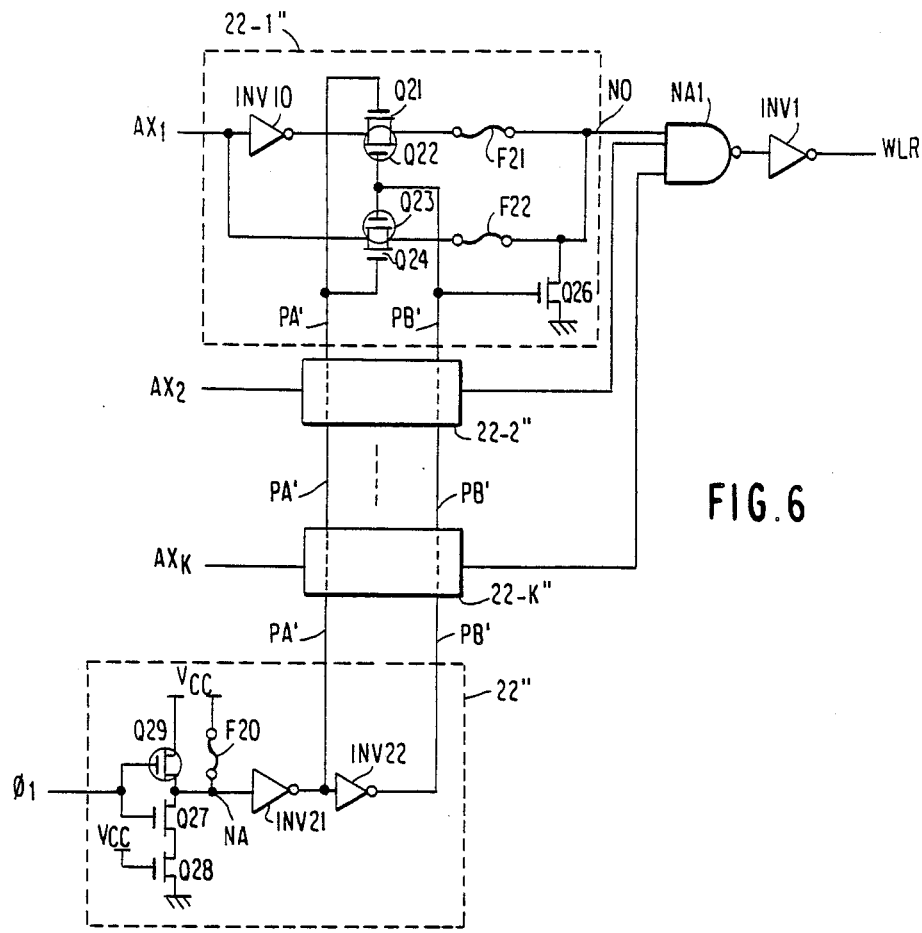
FIG. 6 is a schematic diagram of the redundant decoder according to a second embodiment of the present invention.

With reference to FIG. 6, the redundant decoder according to a second embodiment of the present invention will be explained.

This embodiment is featured by the redundant enable circuit 22' and the address program circuits 22-1" to 22-k". The redundant enable circuit 22' includes a PFET $Q_{29}$, NFETs $Q_{27}$, $Q_{28}$, a fuse F20 and inverters o INV21 and INV22. A clock pulse $\phi 1$ is applied to gates of $Q_{29}$ and $Q_{27}$. The address program circuit 22-1" includes a first CMOS transfer gate composed of an NFET $Q_{21}$ and a PFET $Q_{22}$, a second CMOS transfer gate composed of a PFET $Q_{23}$ and an NFET $Q_{24}$, a first fuse F21 coupled between the output ($\overline{AX1}$) of INV10 and the output node NO with the first CMOS transfer gate in series, a second fuse F22 coupled between the signal AX1 and the output node NO with the second CMOS transfer gate in series and a clamp NFET $Q_{26}$.

When there exists no defective address, the fuse F20 is not blown, and the input to the inverter circuit INV21 assumes "H" irrespective of the clock pulse signal $\phi 1$ to generate PA' of "L" and PB' of "H". Therefore, both of the first and second transfer gates ($Q_{21}$, $Q_{22}$; $Q_{23}$, $Q_{24}$) are not activated in each of the plurality of address program circuits 22-1" to 22-k", and the FET $Q_{26}$ is turned on. Therefore, the plurality of address program circuits 22-1" to 22-k" produce outputs which are all "L". Accordingly, the redundancy decoder produces the output (WLR) which is "L". When there exists a defective address, on the other hand, the fuse F20 is blown and either the fuse 21 or F22 corresponding to the defective address is blown in each of the plurality of address program circuits. When AXi is to be programmed in the address program circuit that receives the address signal AXi (i = 1 to k), the fuse F21 is blown on path between the inverter INV10 and the first transfer gate ($Q_{21}$, $Q_{22}$) When $\overline{AXi}$ is to be programmed, on the other hand, the fuse F22 is blown on a path between the second transfer gate ($Q_{23}$, $Q_{24}$).

It is presumed here that the defective addresses are the combination of AX1, AX2, and AX3. When the redundant decoder is to be used as the one on the row side, the clock pulse signal $\phi 1$ should be brought into synchronism with the row address strobe, e.g., "L→H→L" should be input to the gates of the transistors $Q_{29}$ and $Q_{27}$ so as to be controlled with clocks. Here, if the external addresses change from (AX1, AX2 and AX3) into (AX1, AX2, AX3), the outputs of the address program circuits that receives address signals, AX1, AX2 and AX3 change from "H", "H", "L" into "H", "H", "H", respectively, and are input to the NAND circuit NA1. Therefore, the output (WLR) of the redundant decoder changes from "L" into "H". The output (WLR) change of the redundant decoder from "L" to "H" activates the redundant word line WLR to which the redundancy memory cells are connected.

According to the second embodiment of the present invention, a circuit comprising the fuse F20, inverters INV21 and INV22 and transistors $Q_{20}$, $Q_{21}$ and $Q_{27}$ and controlling the activation of the address program circuits can exhibit the same effects as those of the aforementioned first embodiment. In the second embodiment, however, the MIS transistors $Q_{20}$ and $Q_{27}$ can be controlled by the clock pulse signal $\phi 1$ to prevent the electric current from flowing at all times irrespective of the presence of defective addresses.

Figure 7:
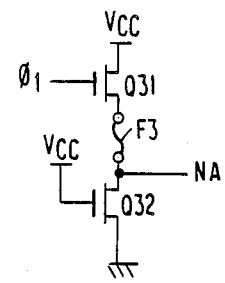
FIG. 7 is a schematic circuit diagram showing a modified part of the redundant decoder of FIG. 6.

The fuse F20 and the FETs $Q_{27}$–$Q_9$ and in the embodiment of FIG. 6 may be substituted by a circuit shown in FIG. 7, and the output PB' of the inverter circuit INV22 may be input to the MIS transistors $Q_{22}$, $Q_{25}$ and $Q_{26}$, and the output PA' of the inverter circuit INV21 may be supplied to the MIS transistors $Q_{21}$ and $Q_{24}$, in order to further simplify the configuration.

In this case, the fuse F30 is blown when there does not exist any defective memory address. When there exist defective memory addresses, the fuse F30 is not blown and a program can be written using the fuses F21, F22 as in the above-mentioned second embodiment.

What is claimed is:

1. A semiconductor memory device comprising a plurality of normal memory cell groups, at least one redundant memory cell group, means for receiving a plurality of address signals, a normal decoder for operatively selecting one of said normal memory cell groups in accordance with said address signals when all of memory cells of one of said normal memory cell groups designated by said address signals are good, and a redundant decoder for operatively selecting said redundant memory cell group when one of said normal memory cell groups designated by said address signals contains at least one defective memory cell, said redundant decoder including a multi-input logic circuit, a plurality of address program circuits, each of said address program circuits having an input end receiving one of said address signal, an output end coupled to one of input terminals of said multi-input logic circuit, first means for generating a complementary signal of the received address signal, and a programmable transfer circuit coupled to said input end, said first means and said output end for applying one of said received address signal and said complementary signal to said output end when enabled and setting said output end at an inactive level when disenabled, a state program circuit assuming a first state when all memory cells of said plurality of memory cell groups are good and a second state when at least one of said normal memory cell groups contains a defective memory cell, and a control circuit for enabling all of said address program circuits in response to said second state of said state program circuit and disenabling all of said address program circuits in response to said first state of said state program circuit 2. The semiconductor memory device according to claim 1, in which each of said normal memory cell groups include a normal word line and said redundant memory cell group includes a redundant word line.

3. The semiconductor memory device according to claim 1, in which said programmable transfer circuit includes a first series connection of a transfer gate and a first fuse coupled between said first means and said output end, and a second series connection of a second transfer gate and a second fuse coupled between said input end and said output end.

4. The semiconductor memory device according to claim 1, in which said state program circuit includes a series circuit of a fuse and a field effect transistor connected between a power voltage terminal and a reference voltage terminal.

5. The semiconductor memory device according to claim 1, in which said programmable transfer circuit includes a first inverter having an input node coupled to said first means, a second inverter having an input node coupled to said input end, a first fuse coupled between an output node of said first inverter and said output end, and a second fuse coupled between an output node of said second inverter and said output end.

* * * * *

UNITED STATES PATENT AND TRADEMARK OFFICE
CERTIFICATE OF CORRECTION

PATENT NO. : 4,975,881
DATED : December 4, 1990
INVENTOR(S) : Akihiko KAGAMI

It is certified that error appears in the above-identified patent and that said Letters Patent is hereby corrected as shown below:

Column 5, line 34, after "inverters", delete "o";

Column 5, line 57, delete "21", and insert --F21--;

Column 5, line 67, delete "AX2, and AX3", and insert --$\overline{AX2}$ and $\overline{AX3}$--.

Column 6, line 5, delete "AX2", and insert --$\overline{AX2}$--;

Column 6, line 6, delete "AX2 and AX3", and insert --$\overline{AX2}$ and $\overline{AX3}$--

Signed and Sealed this

Twenty-ninth Day of September, 1992

Attest:

DOUGLAS B. COMER

*Attesting Officer*     *Acting Commissioner of Patents and Trademarks*